United States Patent
Murakami

(10) Patent No.: US 10,770,296 B2
(45) Date of Patent: Sep. 8, 2020

(54) METHOD OF MANUFACTURING SEMICONDUCTOR DEVICE

(71) Applicant: Mitsubishi Electric Corporation, Tokyo (JP)

(72) Inventor: Takeshi Murakami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/472,142

(22) PCT Filed: Jan. 26, 2017

(86) PCT No.: PCT/JP2017/002623
§ 371 (c)(1),
(2) Date: Jun. 20, 2019

(87) PCT Pub. No.: WO2018/138817
PCT Pub. Date: Aug. 2, 2018

(65) Prior Publication Data
US 2020/0098566 A1    Mar. 26, 2020

(51) Int. Cl.
*H01L 21/04*    (2006.01)
*H01L 29/16*    (2006.01)
(Continued)

(52) U.S. Cl.
CPC ...... *H01L 21/049* (2013.01); *H01L 21/02244* (2013.01); *H01L 21/0485* (2013.01); *H01L 29/1608* (2013.01); *H01L 29/45* (2013.01); *H01L 29/66068* (2013.01); *H01L 29/7811* (2013.01)

(58) Field of Classification Search
None
See application file for complete search history.

(56) References Cited

U.S. PATENT DOCUMENTS

2005/0161732 A1\* 7/2005 Mizukami ........... H01L 29/8083
257/327
2011/0278599 A1   11/2011 Nakao et al.
(Continued)

FOREIGN PATENT DOCUMENTS

JP    2014-150279 A    8/2014

OTHER PUBLICATIONS

International Search Report issued in PCT/JP2017/002623; dated Apr. 25, 2017.

*Primary Examiner* — Asok K Sarkar
(74) *Attorney, Agent, or Firm* — Studebaker & Brackett PC

(57) ABSTRACT

Exposure of a gate conductive film covered by an interlayer insulation film in a unit cell portion is reduced when a gate contact region is formed. A method of manufacturing a semiconductor device includes forming a gate conductive film to come in contact with a gate oxide film in a unit cell portion, forming a gate wire to come in contact with the gate oxide film in a termination region, forming a first insulation film on an upper surface of the gate wire in the termination region, subjecting an upper surface of the gate conductive film in the unit cell portion to thermal oxidation with use of the first insulation film as a mask to form a thermal oxide film on the upper surface of the gate conductive film, and forming a second insulation film covering the first insulation film and the thermal oxide film.

9 Claims, 5 Drawing Sheets

(51) Int. Cl.
*H01L 21/02* (2006.01)
*H01L 29/45* (2006.01)
*H01L 29/66* (2006.01)
*H01L 29/78* (2006.01)

(56) References Cited

U.S. PATENT DOCUMENTS

| | | | |
|---|---|---|---|
| 2015/0357405 A1* | 12/2015 | Ueda | H01L 29/872 257/77 |
| 2017/0229573 A1* | 8/2017 | Kinoshita | H01L 29/7813 |
| 2017/0263745 A1* | 9/2017 | Kinoshita | H01L 29/66068 |
| 2018/0174938 A1* | 6/2018 | Uchida | H01L 29/0615 |
| 2020/0020781 A1* | 1/2020 | Hisada | H01L 29/0619 |
| 2020/0044064 A1* | 2/2020 | Weyers | H01L 29/7302 |

* cited by examiner

F I G. 1 1
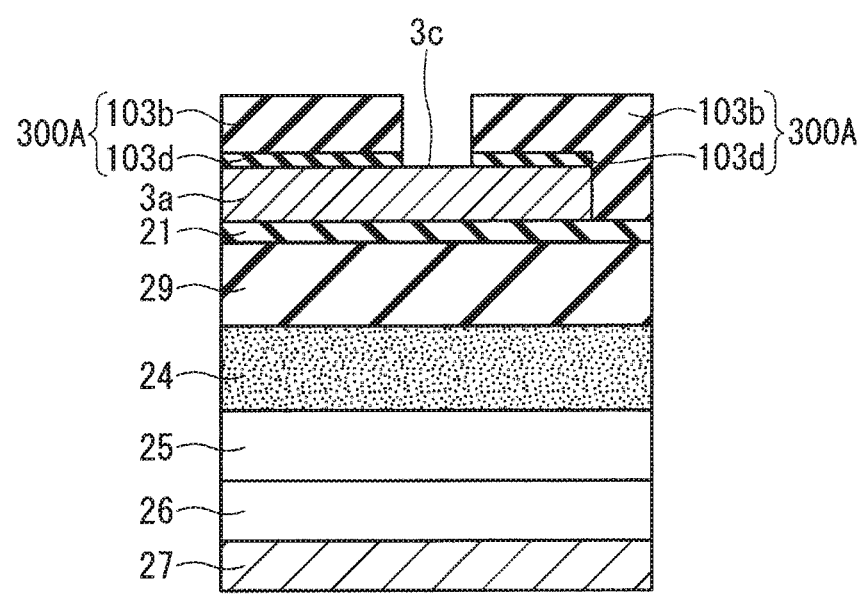

METHOD OF MANUFACTURING SEMICONDUCTOR DEVICE

TECHNICAL FIELD

A technology disclosed in the specification of the present application relates to a SiC-MOSFET including a structure for reducing a leak failure between a gate and a source, for example.

BACKGROUND ART

A manufacturing process of a SiC-metal-oxide-semiconductor field-effect transistor (MOSFET) in a case of using silicon carbide as a semiconductor will be described below.

First, in a unit cell portion, an n-type source implantation region is formed on a surface layer of a p-type well implantation region. Then, a gate oxide film is formed at least on an upper surface of the p-type well implantation region sandwiched between the n-type source implantation region and an n-type epitaxial layer.

Meanwhile, in a termination region, a field oxide film is formed on an upper surface of the p-type well implantation region. Then, a gate oxide film is formed on an upper surface of the field oxide film.

Then, in the unit cell portion, a gate conductive film made of polysilicon or the like is patterned to be formed on an upper surface of the gate oxide film. Further, in the termination region, a gate wire for making a contact with the gate conductive film and a front-surface electrode to be described later in the unit cell portion of the transistor is patterned to be formed on the upper surface of the gate oxide film.

After that, in the unit cell portion, an entire upper surface of the gate conductive film is subjected to cap oxidation to form a thermal oxide film. Then, a CVD oxide film, which is formed with a chemical vapor deposition (CVD) method, covering an upper surface of the thermal oxide film and a side surface of the gate conductive film is formed.

Meanwhile, in the termination region, an upper surface of the gate wire is oxidized to form a thermal oxide film. Then, a CVD oxide film covering an upper surface of the thermal oxide film and a side surface of the gate wire is formed.

Here, in the unit cell portion, the thermal oxide film formed to cover the gate conductive film and the CVD oxide film covering the upper surface of the thermal oxide film and the side surface of the gate conductive film are collectively referred to as an interlayer insulation film in the unit cell portion. A film thickness of the interlayer insulation film in the unit cell portion on the upper surface of the gate conductive film is a thickness obtained by adding together a film thickness of the thermal oxide film and a film thickness of the CVD oxide film.

Further, in the termination region, the thermal oxide film formed to cover the gate wire and the CVD oxide film covering the upper surface of the thermal oxide film and the side surface of the gate wire are collectively referred to as an interlayer insulation film in the termination region. A film thickness of the interlayer insulation film in the termination region on the upper surface of the gate wire is a thickness obtained by adding together a film thickness of the thermal oxide film and a film thickness of the CVD oxide film.

Next, in the unit cell portion, a source contact is opened in the CVD oxide film. Then, in order to reduce contact resistance, a silicide is formed in the source contact region. Further, in the termination region, a gate contact is opened in the interlayer insulation film.

Next, the front-surface electrode covering the source contact region and the gate contact region is formed.

Here, to make an ohmic contact with a silicide of Ni and SiC, i.e., NiSi, high temperature annealing of approximately 1000° C. needs to be performed after depositing Ni.

However, when the silicide is formed in the source contact region in the unit cell portion while the gate contact region is formed in the termination region, the gate wire made of polysilicon or the like in the termination region may abnormally grow due to reaction with Ni at a high temperature of approximately 1000° C. In such a case, polysilicon of the gate wire in the termination region is eliminated.

Accordingly, when the silicide is formed in the source contact region, the interlayer insulation film in the termination region needs to be reserved without forming the gate contact region such that a silicide is not formed in the gate contact region.

Therefore, in the manufacturing process of the SiC-MOSFET, for example, as illustrated in Patent Document 1, first, only the source contact region is opened in the unit cell portion to form a silicide in the region, and then the gate contact region is formed.

PRIOR ART DOCUMENT

Patent Document

Patent Document 1: Japanese Patent Application Laid-Open No. 2014-150279

SUMMARY

Problem to be Solved by the Invention

In the above-mentioned SiC-MOSFET structure, the film thickness of the interlayer insulation film in the unit cell portion and the film thickness of the interlayer insulation film in the termination region are equal. Therefore, for example, if a swelling locally occurs in the interlayer insulation film in the unit cell portion due to presence of a defect caused by a foreign matter or the like on an upper surface of the interlayer insulation film in the unit cell portion or due to presence of a defect caused by a foreign matter or the like on a lower surface of the interlayer insulation film in the unit cell portion, when the gate contact region is patterned with use of a resist, a portion where the swelling of the interlayer insulation film in the unit cell portion occurs cannot be normally covered by the resist.

In such a case, when the gate contact region is etched to be formed, the interlayer insulation film in the unit cell portion not covered by the resist may also be etched. Then, when the interlayer insulation film in the unit cell portion is etched to cause the gate conductive film to be exposed at an unintentional portion, a leak failure between a gate and a source may occur.

The technology disclosed in the specification of the present application has been achieved in order to solve the problems as described above, and relates to a technology of reducing exposure of a gate conductive film covered by an interlayer insulation film in a unit cell portion even when a swelling locally occurs in the interlayer insulation film in the unit cell portion when a gate contact region is formed.

Means to Solve the Problem

A first aspect of a technology disclosed in the specification of the present application includes forming a gate oxide film on an upper surface of a semiconductor layer, forming a gate conductive film to come in contact with the gate oxide film in a unit cell portion, forming a gate wire to come in contact with the gate oxide film in a termination region provided to surround the unit cell portion in plan view, forming a first insulation film on an upper surface of the gate wire in the termination region, subjecting an upper surface of the gate conductive film in the unit cell portion to thermal oxidation with use of the first insulation film as a mask to form a thermal oxide film on the upper surface of the gate conductive film, and forming a second insulation film covering the first insulation film and the thermal oxide film.

Effects of the Invention

The first aspect of the technology disclosed in the specification of the present application includes forming a gate oxide film on an upper surface of a semiconductor layer, forming a gate conductive film to come in contact with the gate oxide film in a unit cell portion, forming a gate wire to come in contact with the gate oxide film in a termination region provided to surround the unit cell portion in plan view, forming a first insulation film on an upper surface of the gate wire in the termination region, subjecting an upper surface of the gate conductive film in the unit cell portion to thermal oxidation with use of the first insulation film as a mask to form a thermal oxide film on the upper surface of the gate conductive film, and forming a second insulation film covering the first insulation film and the thermal oxide film. According to such a configuration, when a gate contact region is formed, exposure of the gate conductive film covered by the interlayer insulation film in the unit cell portion can be reduced even when a swelling locally occurs in the interlayer insulation film in the unit cell portion.

These and other objects, features, aspects and advantages of the technology disclosed in the specification of the present application will become more apparent from the following detailed description when taken in conjunction with the accompanying drawings.

BRIEF DESCRIPTION OF DRAWINGS

FIG. 11 is a cross-sectional view schematically illustrating a cross-sectional structure of the termination region according to the embodiment.

DESCRIPTION OF EMBODIMENT

An embodiment will be described below with reference to the attached drawings.

Note that the drawings are schematically illustrated, and for the sake of description, a configuration is omitted or a configuration is simplified as appropriate. Further, an interrelationship of a size and a position of a configuration etc. illustrated in each different drawing is not necessarily accurately illustrated, and may be changed as appropriate.

Further, in the description below, similar components are denoted by the same reference symbols, and a term and a function of such components are similarly regarded. Accordingly, detailed description of such components may be omitted to avoid redundancy.

Further, in the description below, even when terms signifying a specific position and a direction, such as "up," "down," "left," "right," "side," "bottom," "front," or "back," may be used, these terms are used for the sake of convenience to facilitate understanding of the details of the embodiment, and are not related to directions in a case of actual implementation.

Further, in the description below, even when ordinal numbers, such as "first" or "second," may be used, these terms are used for the sake of convenience to facilitate understanding of the details of the embodiment, and the order etc. that may be defined by these ordinal numbers are not restrictive.

Embodiment

Now, a method of manufacturing a semiconductor device according to the embodiment is described. For the sake of description, first, a structure of a MOSFET is described.

Figure 1:
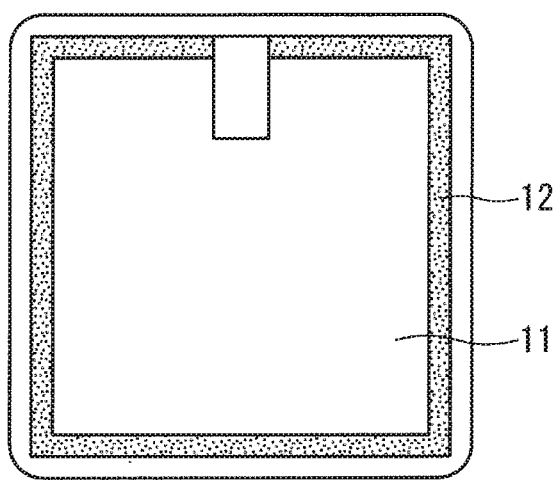
FIG. 1 is a plan view schematically illustrating a structure of a metal-oxide-semiconductor field-effect transistor according to an embodiment.
Figure 2:
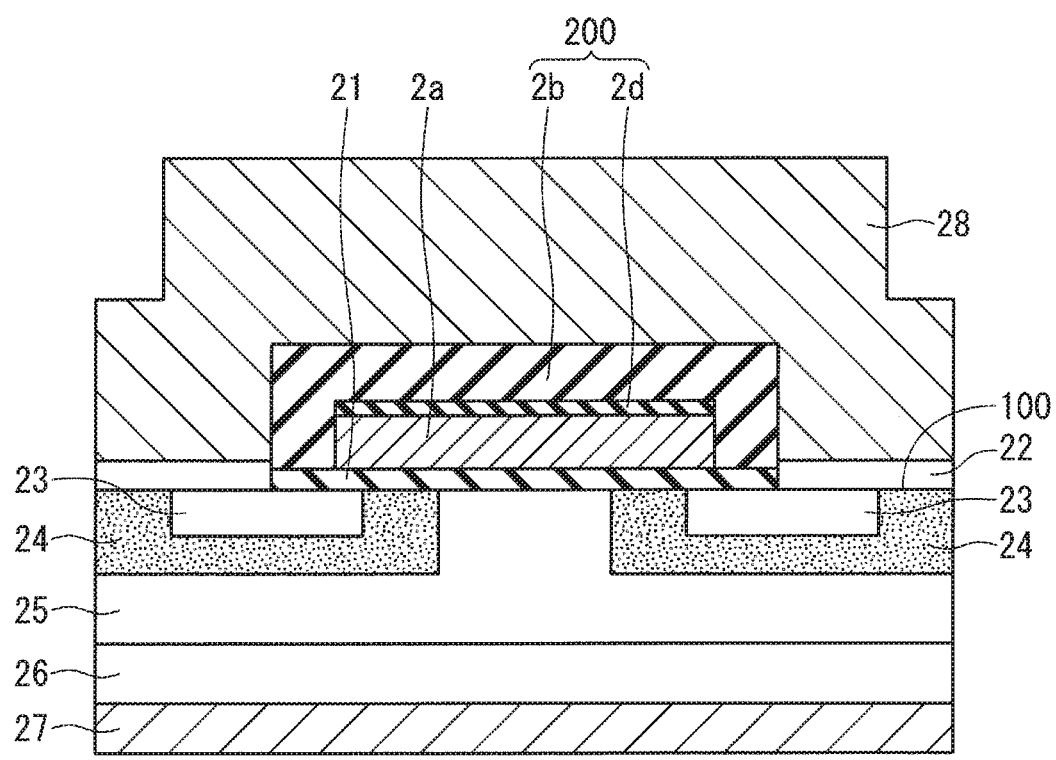
FIG. 2 is a cross-sectional view schematically illustrating a cross-sectional structure of a unit cell portion of the transistor according to the embodiment.

FIG. 1 is a plan view schematically illustrating a structure of a metal-oxide-semiconductor field-effect transistor including a unit cell portion 11 and a termination region 12. Further, FIG. 2 is a cross-sectional view schematically illustrating a cross-sectional structure of the unit cell portion 11 of the transistor. Further, FIG. 3 is a cross-sectional view schematically illustrating a cross-sectional structure of the termination region 12, which is formed to surround the unit cell portion 11 in plan view.

Figure 3:
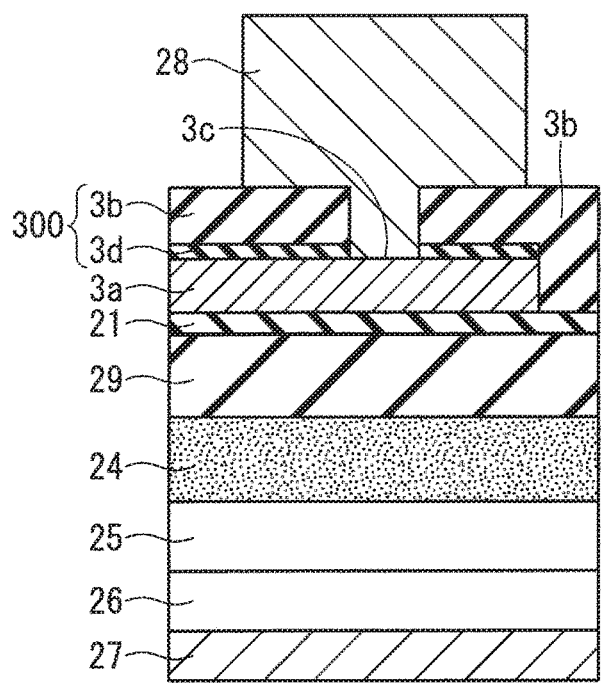
FIG. 3 is a cross-sectional view schematically illustrating a cross-sectional structure of a termination region according to the embodiment.

A manufacturing process of a case in which the transistor illustrated in FIG. 1, FIG. 2, and FIG. 3 is a SiC-MOSFET using silicon carbide as a semiconductor will be described below with reference to FIG. 1, FIG. 2, and FIG. 3.

First, in the unit cell portion 11 and the termination region 12, an n-type epitaxial layer 25 is epitaxially grown on an upper surface of an n-type SiC semiconductor substrate 26. Next, a p-type well implantation region 24 is formed on a surface layer of the epitaxial layer 25.

Next, in the unit cell portion 11, an n-type source implantation region 23 is formed on a surface layer of the p-type well implantation region 24. Then, a gate oxide film 21 is formed at least on an upper surface of the p-type well implantation region 24 sandwiched between the n-type source implantation region 23 and the n-type epitaxial layer 25.

Meanwhile, in the termination region 12, a field oxide film 29 is formed on an upper surface of the p-type well implantation region 24. Then, a gate oxide film 21 is formed on an upper surface of the field oxide film 29.

Then, in the unit cell portion 11, a gate conductive film 2a made of polysilicon or the like is patterned to be formed on an upper surface of the gate oxide film 21. Further, in the termination region 12, a gate wire 3a for making a contact with the gate conductive film 2a and a front-surface electrode 28 to be described later in the unit cell portion 11 of the transistor is patterned to be formed on the upper surface of the gate oxide film 21.

Note that a back-surface electrode 27 is formed on a lower surface of the n-type SiC semiconductor substrate 26.

After that, in the unit cell portion 11, an entire upper surface of the gate conductive film 2a is subjected to cap oxidation to form a thermal oxide film 2d. Then, a CVD oxide film 2b covering an upper surface of the thermal oxide film 2d and a side surface of the gate conductive film 2a is formed.

Meanwhile, in the termination region 12, in the above-mentioned process, an upper surface of the gate wire 3a is oxidized to form a thermal oxide film 3d. Then, a CVD oxide film 3b covering an upper surface of the thermal oxide film 3d and a side surface of the gate wire 3a is formed.

Here, in the unit cell portion 11, the thermal oxide film 2d formed to cover the gate conductive film 2a and the CVD oxide film 2b covering the upper surface of the thermal oxide film 2d and the side surface of the gate conductive film 2a are collectively referred to as an interlayer insulation film 200. A film thickness of the interlayer insulation film 200 on the upper surface of the gate conductive film 2a is a thickness obtained by adding together a film thickness of the thermal oxide film 2d and a film thickness of the CVD oxide film 2b.

Further, in the termination region 12, the thermal oxide film 3d formed to cover the gate wire 3a and the CVD oxide film 3b covering the upper surface of the thermal oxide film 3d and the side surface of the gate wire 3a are collectively referred to as an interlayer insulation film 300. A film thickness of the interlayer insulation film 300 on the upper surface of the gate wire 3a is a thickness obtained by adding together a film thickness of the thermal oxide film 3d and a film thickness of the CVD oxide film 3b.

Next, in the unit cell portion 11, a source contact is opened in the CVD oxide film 2b. Specifically, the CVD oxide film 2b and the gate oxide film 21 are etched to form a source contact region 100. Then, in order to reduce contact resistance, a silicide 22 is formed in the source contact region 100. Note that FIG. 2 illustrates a state in which the source contact region 100 is formed in a manner described above, and the silicide 22 is formed in the source contact region 100.

Further, in the termination region 12, a gate contact is opened in the interlayer insulation film 300. Specifically, the CVD oxide film 3b and the thermal oxide film 3d are etched to form a gate contact region 3c. Note that FIG. 3 illustrates a state in which the gate contact region 3c is formed in a manner described above.

Next, the front-surface electrode 28 covering the source contact region 100 and the gate contact region 3c is formed.

Here, to make an ohmic contact with a silicide of Ni and SiC, i.e., NiSi, high temperature annealing of approximately 1000° C. needs to be performed after depositing Ni.

However, when the silicide 22 is formed in the source contact region 100 in the unit cell portion 11 while the gate contact region 3c is formed in the termination region 12, the gate wire 3a made of polysilicon or the like in the termination region 12 may abnormally grow due to reaction with Ni at a high temperature of approximately 1000° C. In such a case, polysilicon of the gate wire 3a is eliminated.

Accordingly, when the silicide 22 is formed in the source contact region 100, the interlayer insulation film 300 needs to be reserved without forming the gate contact region 3c such that a silicide is not formed in the gate contact region 3c.

Here, in the above-mentioned SiC-MOSFET structure, a film thickness of the interlayer insulation film 200 and a film thickness of the interlayer insulation film 300 are equal. Therefore, for example, if a swelling locally occurs in the interlayer insulation film 200 due to presence of a defect caused by a foreign matter or the like on an upper surface of the interlayer insulation film 200 or due to presence of a defect caused by a foreign matter or the like on a lower surface of the interlayer insulation film 200, when the gate contact region 3c is patterned with use of a resist, a portion where the swelling of the interlayer insulation film 200 occurs cannot be normally covered by the resist.

In such a case, when the gate contact region 3c is etched to be formed, the interlayer insulation film 200 in the unit cell portion 11 not covered by the resist may also be etched. Then, when the interlayer insulation film 200 is etched to cause the gate conductive film 2a to be exposed at an unintentional portion, a leak failure between a gate and a source may occur.

Manufacturing Process of Method of Manufacturing Semiconductor Device

Figure 4:
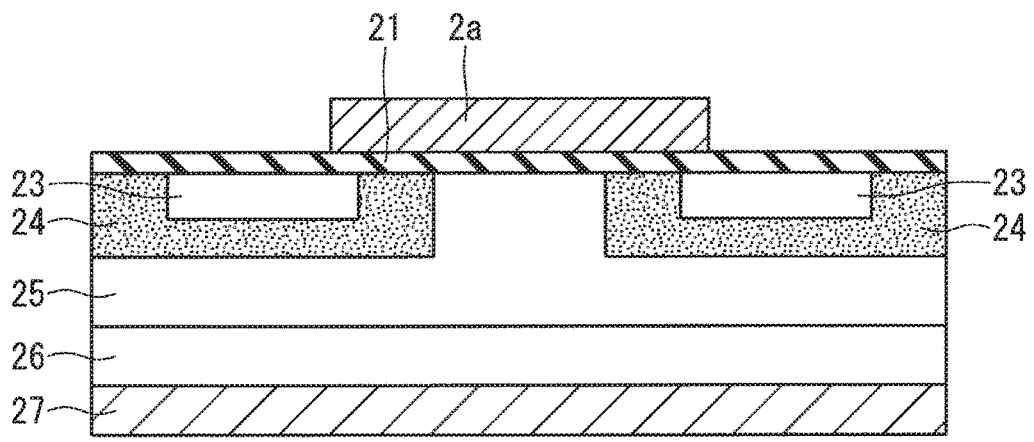
FIG. 4 is a cross-sectional view schematically illustrating a cross-sectional structure of the unit cell portion according to the embodiment.
Figure 5:
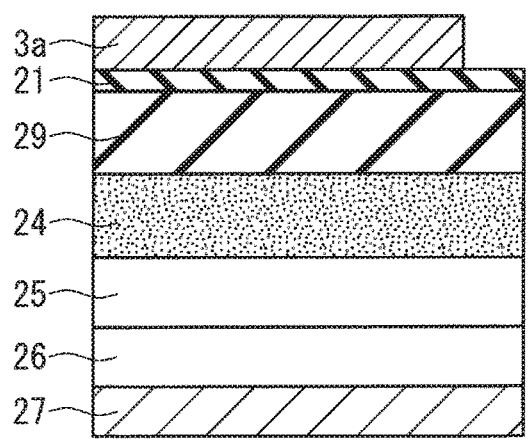
FIG. 5 is a cross-sectional view schematically illustrating a cross-sectional structure of the termination region according to the embodiment.

A method of manufacturing the SiC-MOSFET according to the embodiment will be described below. Here, FIG. 4 is a cross-sectional view schematically illustrating a cross-sectional structure of the unit cell portion according to the embodiment. Further, FIG. 5 is a cross-sectional view schematically illustrating a cross-sectional structure of the termination region according to the embodiment.

First, an n-type epitaxial layer 25 is epitaxially grown on an upper surface of an n-type SiC semiconductor substrate 26. Next, a p-type well implantation region 24 is formed on a surface layer of the epitaxial layer 25.

Next, in the unit cell portion 11, an n-type source implantation region 23 is formed on a surface layer of the p-type well implantation region 24. Then, a gate oxide film 21 is formed at least on an upper surface of the p-type well implantation region 24 sandwiched between the n-type source implantation region 23 and the n-type epitaxial layer 25.

Meanwhile, in the termination region 12, a field oxide film 29 is formed on an upper surface of the p-type well implantation region 24. Then, a gate oxide film 21 is formed on an upper surface of the field oxide film 29.

Then, in the unit cell portion 11, a gate conductive film 2a made of polysilicon or the like is patterned to be formed on an upper surface of the gate oxide film 21. Further, in the termination region 12, a gate wire 3a for making a contact with the gate conductive film 2a and a front-surface electrode 28 to be described later in the unit cell portion 11 of the transistor is patterned to be formed on the upper surface of the gate oxide film 21.

Note that a back-surface electrode 27 is formed on a lower surface of the n-type SiC semiconductor substrate 26.

Next, in the unit cell portion 11 and the termination region 12, for example, an insulation film being a silicon nitride film is formed. Then, etching is performed such that the insulation film is reserved only on an upper surface of the gate wire 3a in the termination region 12, to form an insulation film 103d.

Figure 6:
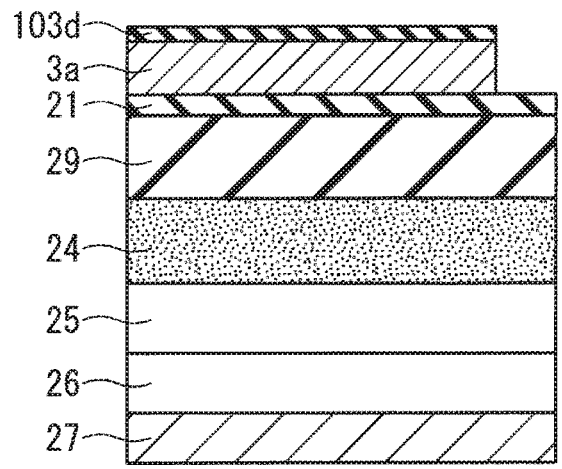
FIG. 6 is a cross-sectional view schematically illustrating a cross-sectional structure of the termination region according to the embodiment.

Here, FIG. 6 is a cross-sectional view schematically illustrating a cross-sectional structure of the termination region according to the embodiment. In FIG. 6, the insulation film 103d is formed only on the upper surface of the gate wire 3a.

Next, with use of the insulation film 103d formed in the termination region 12 as a protective film, i.e., as a mask, in the unit cell portion 11, an upper surface of the gate conductive film 2a is subjected to cap oxidation, i.e., thermal oxidation. In such a manner, a thermal oxide film 102d is formed on the upper surface of the gate conductive film 2a. In this case, the insulation film 103d serves as a protective film of cap oxidation in the termination region 12, and therefore polysilicon of the gate wire 3a in the termination region 12 is not oxidized.

Figure 7:
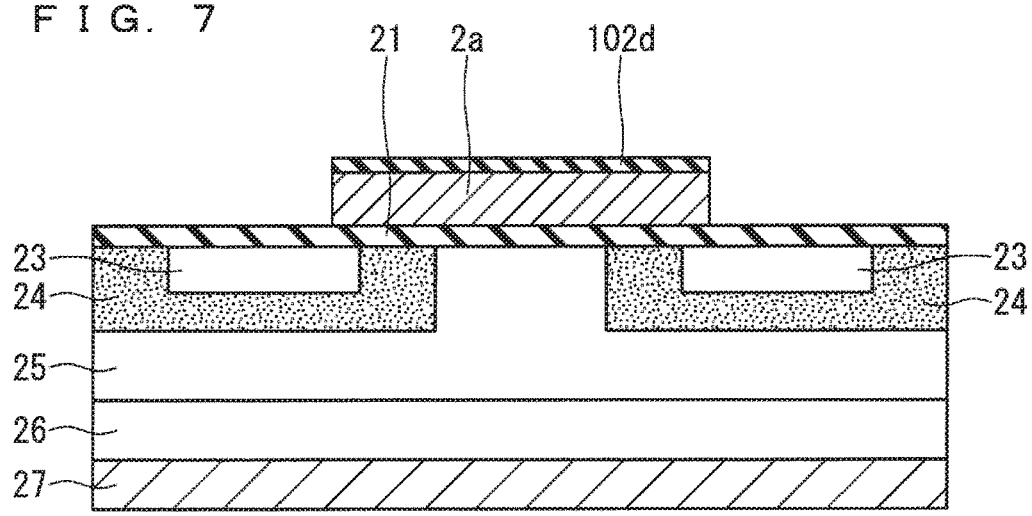
FIG. 7 is a cross-sectional view schematically illustrating a cross-sectional structure of the unit cell portion according to the embodiment.

Here, FIG. 7 is a cross-sectional view schematically illustrating a cross-sectional structure of the unit cell portion according to the embodiment. In FIG. 7, the thermal oxide film 102d is formed on the upper surface of the gate conductive film 2a.

Next, in the unit cell portion 11 and the termination region 12, a CVD oxide film is formed. Specifically, in the unit cell portion 11, a CVD oxide film 102b covering an upper surface of the thermal oxide film 102d and a side surface of the gate conductive film 2a is formed. Note that the oxide film may be an oxide film formed with another method.

Further, in the termination region 12, a CVD oxide film 103b covering an upper surface of the insulation film 103d and a side surface of the gate wire 3a is formed. Note that the oxide film may be an oxide film formed with another method.

Figure 8:
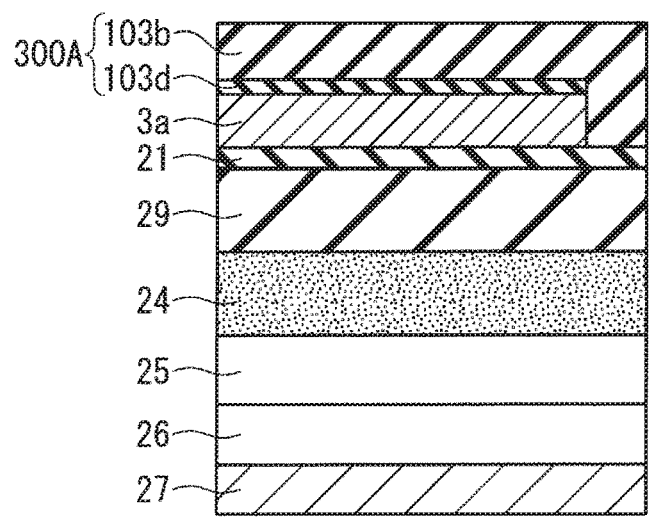
FIG. 8 is a cross-sectional view schematically illustrating a cross-sectional structure of the termination region according to the embodiment.

Here, FIG. 8 is a cross-sectional view schematically illustrating a cross-sectional structure of the termination region according to the embodiment. In FIG. 8, the CVD oxide film 103b covering the upper surface of the insulation film 103d and the side surface of the gate wire 3a is formed.

Here, in the unit cell portion 11, the thermal oxide film 102d formed to cover the gate conductive film 2a and the CVD oxide film 102b covering the upper surface of the thermal oxide film 102d and the side surface of the gate conductive film 2a are collectively referred to as an interlayer insulation film 200A. A film thickness of the interlayer insulation film 200A on the upper surface of the gate conductive film 2a is a thickness obtained by adding together a film thickness of the thermal oxide film 102d and a film thickness of the CVD oxide film 102b.

Further, in the termination region 12, the insulation film 103d formed to cover the gate wire 3a and the CVD oxide film 103b covering the upper surface of the insulation film 103d and the side surface of the gate wire 3a are collectively referred to as an interlayer insulation film 300A. A film thickness of the interlayer insulation film 300A on the upper surface of the gate wire 3a is a thickness obtained by adding together a film thickness of the insulation film 103d and a film thickness of the CVD oxide film 103b.

As described above, the insulation film 103d and the thermal oxide film 102d are formed through different processes. Accordingly, the film thickness of the thermal oxide film 102d in the unit cell portion 11 can be increased to be larger than the film thickness of the insulation film 103d in the termination region 12 by adjusting each forming condition, such as forming time.

Figure 9:
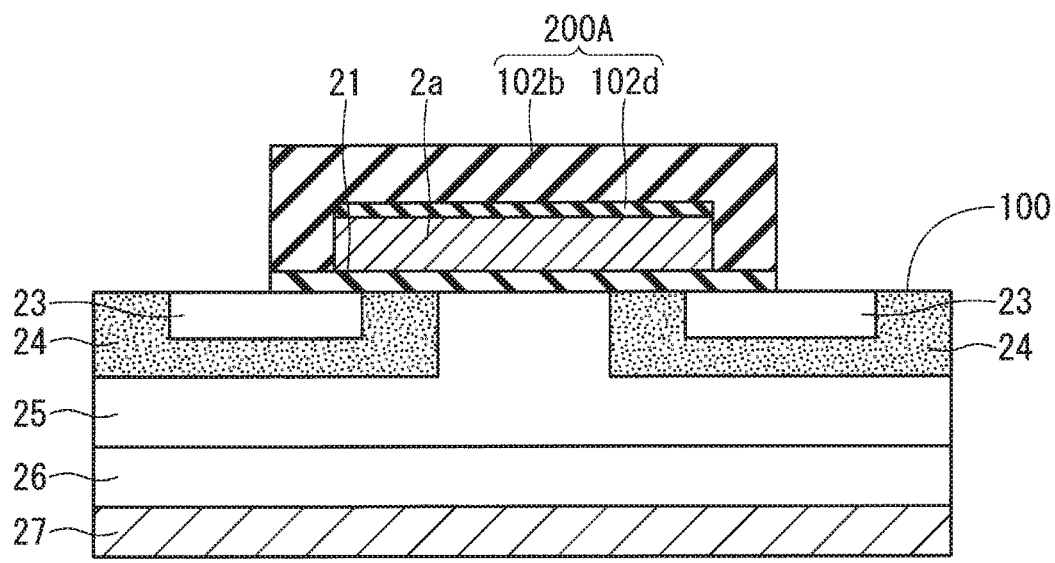
FIG. 9 is a cross-sectional view schematically illustrating a cross-sectional structure of the unit cell portion according to the embodiment.

Next, in the unit cell portion 11, the CVD oxide film 102b and the gate oxide film 21 are etched to form a source contact region 100. The source contact region 100 exposes the source implantation region 23. Here, FIG. 9 is a cross-sectional view schematically illustrating a cross-sectional structure of the unit cell portion according to the embodiment. In FIG. 9, the source contact region 100 is formed in the CVD oxide film 102b.

Figure 10:
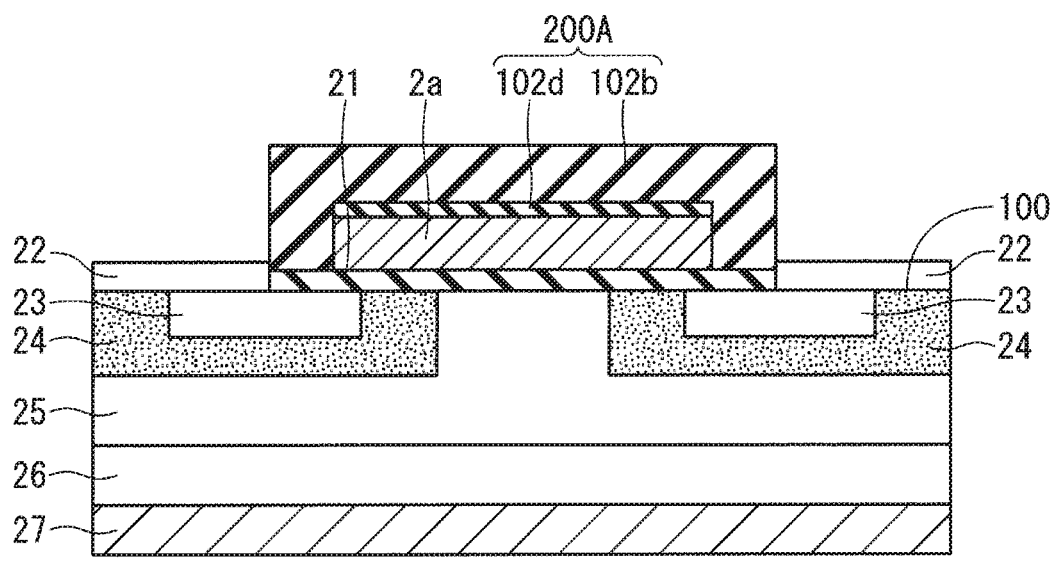
FIG. 10 is a cross-sectional view schematically illustrating a cross-sectional structure of the unit cell portion according to the embodiment.

Then, in order to reduce contact resistance, a silicide 22 is formed in the source contact region 100. Here, FIG. 10 is a cross-sectional view schematically illustrating a cross-sectional structure of the unit cell portion according to the embodiment. In FIG. 10, the silicide 22 is formed in the source contact region 100. In this case, a gate contact in the termination region 12 is not opened, and therefore the gate wire 3a made of polysilicon or the like does not react with Ni at a high temperature.

Next, in the termination region 12, a gate contact is opened in the interlayer insulation film 300A. Specifically, the CVD oxide film 103b is etched with use of a resist mask, and the insulation film 103d is etched with use of the same resist mask, to form a gate contact region 3c. The gate contact region 3c exposes the gate wire 3a.

Here, the insulation film 103d is made of a type of a material different from that of the CVD oxide film 102b, the thermal oxide film 102d, and the CVD oxide film 103b. Therefore, when the insulation film 103d is etched through a process of usual etching, i.e., reactive ion etching (RIE), the CVD oxide film 102b and the thermal oxide film 102d are not etched.

Further, because the film thickness of the thermal oxide film 102d is larger than the film thickness of the insulation film 103d, the film thickness of the interlayer insulation film 200A in the unit cell portion 11 becomes larger than the film thickness of the interlayer insulation film 300A in the termination region 12.

Therefore, exposure of the gate conductive film 2a from the interlayer insulation film 200A due to etching can be reduced even when a local swelling occurs in the interlayer insulation film 200A in the unit cell portion 11 and the portion cannot be normally covered by a resist. Accordingly, occurrence of a leak failure between a gate and a source, which is caused due to exposure of the gate conductive film 2a, can be reduced.

Note that, in the case of usual etching, i.e., RIE, etching including over-etching is performed. Therefore, regarding etching time or an etching amount, etching approximately 1.5 times as much as an actual film thickness of the CVD oxide film 103b is performed.

Therefore, when an etching treatment including over-etching is taken into consideration, it is desirable that the film thickness of the thermal oxide film 102d formed by thermal oxidation, i.e., cap oxidation, of the gate conductive film 2a in the unit cell portion 11 be 0.5 times or more as large as the film thickness of the CVD oxide film 103b.

FIG. 11 is a cross-sectional view schematically illustrating a cross-sectional structure of the termination region according to the embodiment. In FIG. 11, the gate contact region 3c is formed in the interlayer insulation film 300A.

Next, the front-surface electrode 28 covering the source contact region 100 and the gate contact region 3c is formed.

Effect Generated by Embodiment Described Above

Next, an effect generated by the embodiment described above will be illustrated. Note that the following description describes the effect based on a specific configuration illustrated in the embodiment described above. However, the specific configuration may be replaced by another specific configuration illustrated in the specification of the present application as long as a similar effect is generated.

According to the embodiment described above, in the method of manufacturing the semiconductor device, the gate oxide film 21 is formed on the upper surface of a semiconductor layer. Then, the gate conductive film 2a to come in contact with the gate oxide film 21 is formed in the unit cell portion 11. Then, the gate wire 3a to come in contact with the gate oxide film 21 is formed in the termination region 12. Then, a first insulation film is formed on the upper surface of the gate wire 3a in the termination region 12. Then, the upper surface of the gate conductive film 2a in the unit cell portion 11 is subjected to thermal oxidation with use of the first insulation film as a mask to form the thermal oxide film 102d on the upper surface of the gate conductive film 2a. Then, a second insulation film covering the first insulation film and the thermal oxide film 102d is formed. Here, for example, the semiconductor layer corresponds to the n-type epitaxial layer 25. Further, for example, the first insulation film corresponds to the insulation film 103d. Further, for example, the second insulation film covering the first insulation film corresponds to the CVD oxide film 103b. Further, for example, the second insulation film covering the thermal oxide film 102d corresponds to the CVD oxide film 102b.

According to such a configuration, when the gate contact region 3c is formed, exposure of the gate conductive film 2a covered by the interlayer insulation film 200A in the unit cell portion 11 can be reduced even when a swelling locally occurs in the interlayer insulation film 200A in the unit cell portion. Specifically, after the insulation film 103d is formed, the upper surface of the gate conductive film 2a in the unit cell portion 11 is subjected to thermal oxidation with use of the insulation film 103d as a mask to form the thermal oxide film 102d on the upper surface of the gate conductive film 2a. Accordingly, the film thickness of the thermal oxide film 102d can be increased to be larger than the film thickness of the insulation film 103d by adjusting a forming condition when the thermal oxide film 102d is formed. Specifically, the film thickness of the interlayer insulation film 200A including the thermal oxide film 102d can be increased to be larger than the film thickness of the interlayer insulation film 300A including the insulation film 103d. Accordingly, exposure of the gate conductive film 2a covered by the interlayer insulation film 200A can be reduced even if the interlayer insulation film 200A in the unit cell portion 11 is etched when the gate contact region 3c is formed. Further, because the thermal oxide film 102d is formed with use of the insulation film 103d formed in the previous process as a mask, another mask need not be separately prepared to form the thermal oxide film 102d.

Note that other configurations illustrated in the specification of the present application except these configurations may be omitted as appropriate. Specifically, provided that at least these configurations are included, the effect described above can be generated.

However, the effect described above can also be similarly generated when at least one of other configurations illustrated in the specification of the present application is added to the configuration described above as appropriate, i.e., when another configuration illustrated in the specification of the present application but not described as the configuration described above is added to the configuration described above.

Further, the order of performing each treatment may be changed as long as there is no limitation.

Further, according to the embodiment described above, the upper surface of the gate conductive film 2a in the unit cell portion 11 is subjected to thermal oxidation with use of the first insulation film as a mask to form the thermal oxide film 102d thicker than the first insulation film on the upper surface of the gate conductive film 2a. Here, for example, the first insulation film corresponds to the insulation film 103d. According to such a configuration, exposure of the gate conductive film 2a covered by the interlayer insulation film 200A can be reduced even if the interlayer insulation film 200A in the unit cell portion 11 is etched when the gate contact region 3c is formed.

Further, according to the embodiment described above, the second insulation film is an oxide film. Here, for example, the second insulation film covering the first insulation film corresponds to the CVD oxide film 103b. Further, for example, the second insulation film covering the thermal oxide film 102d corresponds to the CVD oxide film 102b. According to such a configuration, exposure of the gate conductive film 2a covered by the interlayer insulation film 200A can be reduced even if the interlayer insulation film 200A in the unit cell portion 11 is etched when the gate contact region 3c is formed.

Further, according to the embodiment described above, the film thickness of the thermal oxide film 102d is 0.5 times or more as large as the film thickness of the second insulation film. Here, for example, the second insulation film covering the first insulation film corresponds to the CVD oxide film 103b. Further, for example, the second insulation film covering the thermal oxide film 102d corresponds to the CVD oxide film 102b. According to such a configuration, exposure of the gate conductive film 2a covered by the interlayer insulation film 200A can be effectively reduced even if the CVD oxide film 103b is subjected to an etching treatment including over-etching when the gate contact region 3c is formed.

Further, according to the embodiment described above, in the unit cell portion 11, the source contact region 100 exposing the source implantation region 23 is formed. Then, the silicide 22 is formed in the source contact region 100. According to such a configuration, a gate contact is not opened when the silicide 22 is formed, and therefore the gate wire 3a made of polysilicon or the like does not react with Ni at a high temperature.

Further, according to the embodiment described above, after the silicide 22 is formed in the unit cell portion 11, in the termination region 12, the gate contact region 3c for exposing the gate wire 3a is formed. According to such a configuration, a gate contact is not opened when the silicide 22 is formed, and therefore the gate wire 3a made of polysilicon or the like does not react with Ni at a high temperature.

Further, according to the embodiment described above, the semiconductor layer is made of SiC. Here, for example, the semiconductor layer corresponds to the n-type epitaxial layer 25. According to such a configuration, exposure of the gate conductive film 2a covered by the interlayer insulation film 200A can be reduced even if the interlayer insulation film 200A in the unit cell portion 11 is etched when the gate contact region 3c is formed.

Further, according to the embodiment described above, the second insulation film covering the upper surface of the first insulation film and the side surface of the gate wire 3a and the upper surface of the thermal oxide film 102d and the side surface of the gate conductive film 2a is formed. Here, for example, the first insulation film corresponds to the insulation film 103d. Further, for example, the second insulation film covering the upper surface of the first insulation film and the side surface of the gate wire 3a corresponds to the CVD oxide film 103b. Further, for example, the second insulation film covering the upper surface of the thermal oxide film 102d and the side surface of the gate conductive film 2a corresponds to the CVD oxide film 102b. According to such a configuration, exposure of the gate conductive film 2a covered by the interlayer insulation film 200A can be reduced even if the interlayer insulation film 200A in the unit cell portion 11 is etched when the gate contact region 3c is formed.

Further, according to the embodiment described above, the field oxide film 29 is formed on the upper surface of the semiconductor layer in the termination region 12. Then, in the termination region 12, the gate oxide film 21 is formed on the upper surface of the field oxide film 29. Here, for example, the semiconductor layer corresponds to the n-type epitaxial layer 25. According to such a configuration, exposure of the gate conductive film 2a covered by the interlayer insulation film 200A can be reduced even if the interlayer insulation film 200A in the unit cell portion 11 is etched when the gate contact region 3c is formed.

Modifications of Embodiment Described Above

While the embodiment described above may describe quality of a material, a material, a dimension, a shape, and a relative disposition relationship of each component, as well as a condition of implementation or the like, these are in all aspects illustrative and are not limited to the description of the specification of the present application.

Accordingly, unillustrated numerous modifications and equivalents are assumed within the scope of the technology disclosed in the specification of the present application. For example, a case of modifying, adding, or omitting at least one component is encompassed.

Further, a component described to be provided as "one" component in the embodiment described above may be provided as "one or more" components unless contradiction arises.

Further, each component in the embodiment described above is a conceptual unit. The scope of the technology disclosed in the specification of the present application encompasses a case in which one component is made of a plurality of structures, a case in which one component corresponds to a part of a certain structure, and a case in which a plurality of components are included in one structure.

Further, each component in the embodiment described above encompasses a structure having another structure or shape as long as the component exerts the same function.

Further, description in the specification of the present application is referred to for all of the purposes concerning the present technology, any of which is not to be admitted to be prior art.

Further, in the embodiment described above, when a name of a material is described without particular specification, another material, such as an alloy, which is obtained by adding another additive to the material, is encompassed unless contradiction arises.

Further, in the embodiment described above, the semiconductor substrate is an n type. However, the semiconductor substrate may be a p type. Specifically, the embodiment described above describes a MOSFET as an example of a silicon carbide semiconductor device. However, the embodiment described above may also assume a case in which an example of the silicon carbide semiconductor device is an insulated gate bipolar transistor (IGBT).

Note that, if an example of the silicon carbide semiconductor device is an IGBT, a source electrode corresponds to an emitter electrode, and a drain electrode corresponds to a collector electrode. Further, if an example of the silicon carbide semiconductor device is an IGBT, a layer having a conductivity type opposite to that of a drift layer is located on a lower surface of the drift layer. However, the layer located on the lower surface of the drift layer may be a layer newly formed on the lower surface of the drift layer, or may be a semiconductor substrate for the drift layer to be formed as in the embodiment described above.

Further, in the embodiment described above, the thermal oxide film 102d is formed on the upper surface of the gate conductive film 2a. However, the thermal oxide film 102d may be formed also on the side surface of the gate conductive film 2a, in addition to the upper surface of the gate conductive film 2a. Further, the insulation film 103d is formed on the upper surface of the gate wire 3a. However, the insulation film 103d may be formed also on the side surface of the gate wire 3a, in addition to the upper surface of the gate wire 3a.

Further, the embodiment described above describes a so-called vertical MOSFET. However, the embodiment described above may also assume a case in which a horizontal MOSFET is used.

Further, the embodiment described above describes a planar MOSFET. However, the embodiment described above may also assume a case in which a trench MOSFET, which has a trench formed on an upper surface of a drift layer, is used. In a case of the trench MOSFET, a groove portion, i.e., a trench, is formed on an upper surface of a drift layer, and a gate electrode is embedded on the upper surface of the drift layer in the groove portion, i.e., on a bottom surface of the trench, via a gate insulation film.

EXPLANATION OF REFERENCE SIGNS 2a gate conductive film, 2b, 3b, 102b, 103b CVD oxide film, 2d, 3d, 102d thermal oxide film, 3a gate wire, 3c gate contact region, 11 unit cell portion, 12 termination region, 21 gate oxide film, 22 silicide, 23 source implantation region, 24 well implantation region, 25 epitaxial layer, 26 SiC semiconductor substrate, 27 back-surface electrode, 28 front-surface electrode, 29 field oxide film, 100 source contact region, 103d insulation film, 200, 200A, 300, 300A interlayer insulation film

The invention claimed is:

1. A method of manufacturing a semiconductor device, the method comprising:
    forming a gate oxide film on an upper surface of a semiconductor layer;
    forming a gate conductive film to come in contact with the gate oxide film in a unit cell portion;
    forming a gate wire to come in contact with the gate oxide film in a termination region provided to surround the unit cell portion in plan view;
    forming a first insulation film on an upper surface of the gate wire in the termination region;
    subjecting an upper surface of the gate conductive film in the unit cell portion to thermal oxidation with use of the first insulation film as a mask to form a thermal oxide film on the upper surface of the gate conductive film; and forming a second insulation film covering the first insulation film and the thermal oxide film.

2. The method of manufacturing a semiconductor device according to claim 1, wherein
the second insulation film is an oxide film.

3. The method of manufacturing a semiconductor device according to claim 1, wherein
a film thickness of the thermal oxide film is 0.5 times or more as large as a film thickness of the second insulation film.

4. The method of manufacturing a semiconductor device according to claim 1, wherein
a source contact region is formed in the unit cell portion, and
a silicide is formed in the source contact region.

5. The method of manufacturing a semiconductor device according to claim 4, wherein
after the silicide is formed in the unit cell portion, a gate contact region is formed in the termination region.

6. The method of manufacturing a semiconductor device according to claim 1, wherein
the semiconductor layer is made of SiC.

7. The method of manufacturing a semiconductor device according to claim 1, wherein
the second insulation film covering an upper surface of the first insulation film and a side surface of the gate wire, and an upper surface of the thermal oxide film and a side surface of the gate conductive film is formed.

8. The method of manufacturing a semiconductor device according to claim 1, wherein
a field oxide film is formed on the upper surface of the semiconductor layer in the termination region, and
the gate oxide film is formed on an upper surface of the field oxide film in the termination region.

9. The method of manufacturing a semiconductor device according to claim 1, wherein
the thermal oxide film is formed also on a side surface of the gate conductive film, in addition to the upper surface of the gate conductive film.

\* \* \* \* \*